United States Patent
Kwon

(10) Patent No.: US 6,194,257 B1
(45) Date of Patent: Feb. 27, 2001

(54) FABRICATION METHOD OF GATE ELECTRODE HAVING DUAL GATE INSULATING FILM

(75) Inventor: Jae-Soon Kwon, Kyungki-Do (KR)

(73) Assignee: LG Semicon Co., Ltd., Choongcheongbuk-Do (KR)

( * ) Notice: Subject to any disclaimer, the term of this patent is extended or adjusted under 35 U.S.C. 154(b) by 0 days.

(21) Appl. No.: 09/187,003

(22) Filed: Nov. 6, 1998

(30) Foreign Application Priority Data

Dec. 29, 1997 (KR) ................................. 97-76817

(51) Int. Cl.⁷ ................................. H01L 21/8238
(52) U.S. Cl. .................. 438/199; 438/279; 438/301; 438/392
(58) Field of Search .................. 438/275, 199; 257/392

(56) References Cited

U.S. PATENT DOCUMENTS

| | | | |
|---|---|---|---|
| 4,471,373 | * | 9/1984 | Shimizu et al. . |
| 4,516,316 | * | 5/1985 | Haskell . |
| 4,882,289 | * | 11/1989 | Moriuchi et al. . |
| 5,497,021 | | 3/1996 | Tada ........................ 257/369 |
| 5,502,009 | * | 3/1996 | Lin . |
| 5,576,226 | * | 11/1996 | Hwang . |
| 5,595,922 | * | 1/1997 | Tigelaar et al. . |
| 5,716,863 | * | 2/1998 | Arai . |
| 5,766,970 | * | 6/1998 | Kim et al. . |
| 5,841,174 | * | 11/1998 | Arai . |
| 5,866,445 | * | 2/1999 | Baumann . |
| 5,893,737 | * | 4/1999 | Takahi et al. . |
| 5,960,289 | * | 6/1998 | Tsui et al. . |
| 5,989,962 | * | 11/1999 | Holloway et al. . |

OTHER PUBLICATIONS

Wolf, Silicon Processing for the VLSI Era, vol. 2, pp. 65, 1990.*

* cited by examiner

Primary Examiner—John F. Niebling
Assistant Examiner—Jonathan Hack
(74) Attorney, Agent, or Firm—Morgan, Lewis & Bockius LLP

(57) ABSTRACT

A method of fabricating a gate electrode having dual gate insulating film includes the steps of sequentially providing a substrate having a first portion and a second portion, forming a first insulating film on the first portion of substrate, a first conductive film on the first insulating film and a second insulating film on the first conductive film, forming a third insulating film on the second portion of the substrate, forming a second conductive film on the second and the third insulating films, and patterning the first and the second conductive film to form a gate electrode.

9 Claims, 3 Drawing Sheets

FABRICATION METHOD OF GATE ELECTRODE HAVING DUAL GATE INSULATING FILM

This application claims the benefit of Korean Patent Application No. 76817/1997, filed Dec. 29, 1997, which is hereby incorporated by reference.

BACKGROUND OF THE INVENTION

1. Field of the Invention

The present invention relates to a semiconductor device, and more particularly, to a fabrication method of a gate electrode having a dual gate insulating film.

2. Discussion of the Related Art

A conventional fabrication method of a gate electrode having a dual gate insulating film will be described with reference to the accompanying drawings.

FIGS. 1A–1E are cross-sectional diagrams sequentially illustrating a conventional fabrication method of the gate electrode having the dual gate insulating film.

Figure 1A:
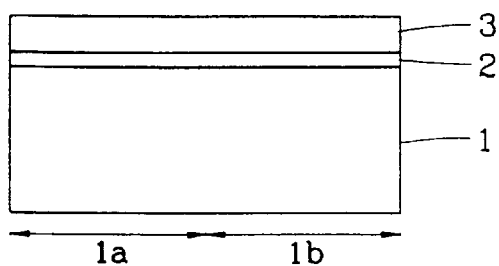

As shown in FIG. 1A, a first insulating film (gate insulating film) 2 is formed on a semiconductor substrate 1 having a first portion 1a and a second portion 1b, and a photoresist film 3 is formed thereon. The first insulating film 2 is a silicon oxide film and is usually formed by a thermal oxidation process. A thickness of gate insulating films to be formed on the first and the second portions 1a, 1b may be different from each other.

Figure 1B:
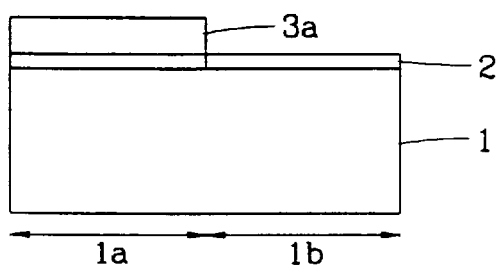

As shown in FIG. 1B, the photoresist film 3 is etched and patterned to expose the first insulating film 2 corresponding to the second portion 1b of the substrate 1. Therefore, a photoresist film 3a is formed.

Figure 1C:
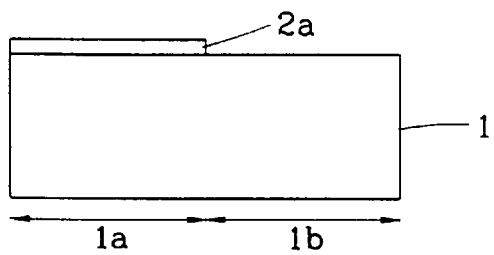

Next, as shown in FIG. 1C, in order to expose the second portion 1b of the semiconductor substrate 1, the first insulating film 2 is etched and patterned using the photoresist pattern 3a as a mask. Therefore, a first insulating film pattern 2a is formed, and the photoresist pattern 3a is then removed by a wet-dip process, wherein the semiconductor substrate 1 including the first insulating film pattern 2a and the photoresist pattern 3a is dipped into an etching solution and then taken out.

Figure 1D:
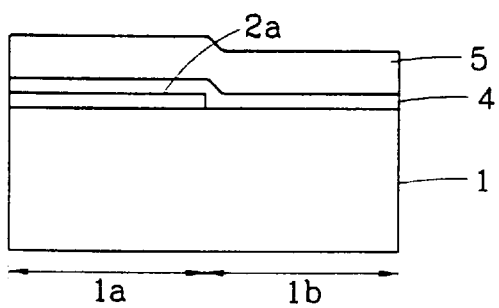

As shown in FIG. 1D, a second insulating film 4 (gate insulating film) is formed on the semiconductor substrate 1 having the first insulating film pattern 2a, and a conductive film 5 is formed on the second insulating film 4. The second insulating film 4 is a silicon oxide film and is usually formed by a thermal oxidation process, and the conductive film 5 is a polysilicon film and is usually formed by a chemical vapor deposition (CVD).

Figure 1E:
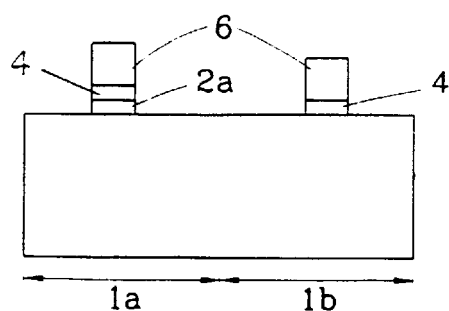

As shown in FIG. 1E, a gate electrode 6 is respectively formed on the first and the second portions 1a, 1b of the semiconductor substrate 1 by patterning the conductive film 5. A thickness of the gate insulating film of the first portion 1a is thicker than that of the second portion 1b.

According to the conventional method, the gate insulating film is often contaminated by infiltrating through a diffusion for metallic and carbonaceous elements of the photoresist film when the gate insulating film is etched and patterned using the photoresist film as a mask, and is easily damaged because it is difficult to control etched volume of the photoresist film. Therefore, the gate insulating film may not have uniform thickness, reducing reliability of the semiconductor device.

SUMMARY OF THE INVENTION

Accordingly, the present invention is directed to a fabrication method of gate electrode having dual gate insulating film that substantially obviates one or more of the problems due to the limitations and disadvantages of the related art.

An object of the present invention is to provide a gate electrode having a dual gate insulating film of high reliability on a semiconductor substrate having a stepped surface.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in accordance with a first aspect of the present invention there is provided a method of fabricating a gate electrode having dual gate insulating film including the steps of sequentially providing a substrate having a first portion and a second portion, forming a first insulating film on the first portion of the substrate, a first conductive film on the first insulating film and a second insulating film on the first conductive film, forming a third insulating film on the second portion of the substrate, forming a second conductive film on the second and the third insulating films, and patterning the first and the second conductive film to form a gate electrode.

In another aspect of the present invention there is provided a method of forming a gate electrode having dual gate insulating film including the steps of providing a substrate having a first portion and a second portion, forming a first insulating film on the substrate and a second insulating film on the first insulating film, removing the second insulating film corresponding to the first portion to expose the first insulating film, forming a third insulating film by oxidizing the second portion of the substrate, removing the first, second, and third insulating films to form a step in the substrate between the first portion and the second portion, forming a fourth insulating film on the first portion of the substrate, a first conductive film on the fourth insulating film and a fifth insulating film on the first conductive film, forming a sixth insulating film on the second portion of the substrate, forming a second conductive film on the second and the third insulating films, and patterning the first and the second conductive film to form the gate electrode.

In another aspect of the present invention there is provided a method of forming a gate electrode having dual gate insulating film including the steps of providing a substrate having a first portion and a second portion, forming a step in the substrate between the first portion and the second portion, forming a first insulating film on the first portion of the substrate, a first conductive film on the first insulating film and a second insulating film on the first conductive film, forming a third insulating film on the second portion of the substrate, forming a second conductive film on the second and the third insulating films, and patterning the first and second conductive films to form the gate electrode.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawing:

FIGS. 1A–1E are cross-sectional diagrams sequentially illustrating a conventional fabrication method of a gate electrode having a dual gate insulating film; and FIGS. 2A–2G cross-sectional diagrams sequentially illustrating a fabrication method of a gate electrode having a dual gate insulating film according to the present invention.

DETAILED DESCRIPTION OF THE PREFERRED EMBODIMENT

Reference will now be made in detail to the preferred embodiment of the present invention, an example of which is illustrated in the accompanying drawings.

Figure 2A:
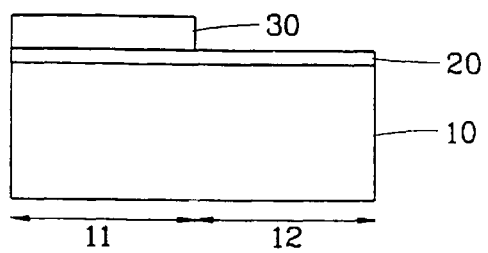

As shown in FIG. 2A, a first insulating film 20 is formed on a semiconductor substrate 10 having a first portion 11 and a second portion 12, and a second insulating film 30 is formed on the first insulating film 20 corresponding to the first portion 11. The first insulating film 20 corresponding to the second portion 12 is exposed. The first insulating film 20 is a silicon oxide film (a pad oxide film) and the second insulating film 30 is a silicon nitride film (an oxidation preventing film). The first and the second portions 11, 12 of the semiconductor substrate 10 indicate a portion which a gate insulating film is formed, and a thickness of gate insulating films to be formed on the first and the second portions 11, 12 may be different from each other.

Figure 2B:
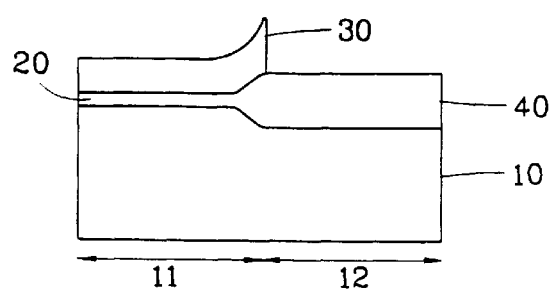

As shown in FIG. 2B, a third insulating 40 is formed by oxidizing the exposed first insulating film 20 using the second insulating film 30 as a oxidation preventing mask. The third insulating film 40 is a thermal silicon oxide film grown through a thermal oxidation process. Since oxidation of silicon proceeds not only in the direction normal to the surface of the semiconductor substrate 10, but also laterally into the pad oxide (the first insulating film), the result is penetration of the growing oxide beneath the second insulating film 40. Simultaneous volume expansion of the growing oxide takes place, and hence the edges of the second insulating film 40 are lifted up. That are , a bird's beak is formed. Then, the first, the second, and the third insulating films 20, 30, 40 is removed to form a step in the surface of the substrate 10 between the first portion 11 and the second portion 12.

Figure 2C:
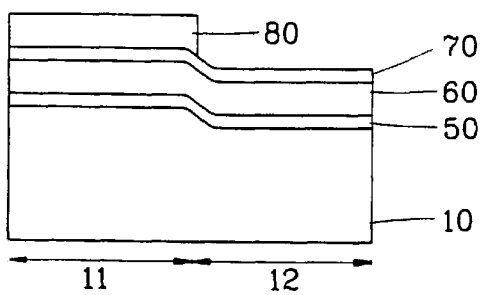

As shown in FIG. 2C, a fourth insulating film 50 is formed over the semiconductor substrate 10 having the step, a first conductive film 60 on the fourth insulating film 50, a fifth insulating film 70 on the first conductive film 60, and a photoresist film 80 on the fifth insulating film 70 corresponding to the first portion 11 of substrate 10 to expose the fifth insulating film 70 corresponding to the second portion 12 of substrate 10. The fourth insulating film 50 is a silicon oxide film, and the first conductive film 60 is a polysilicon film, and the fifth insulating film 70 is a silicon nitride film.

Figure 2D:
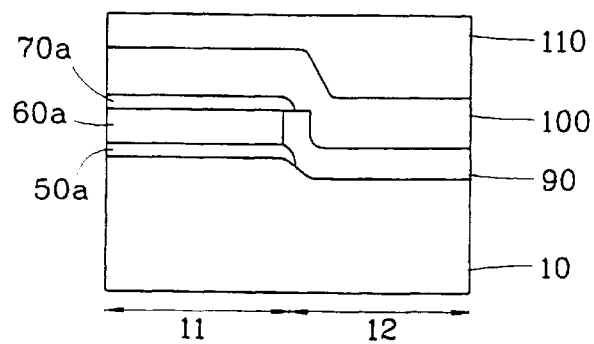

As shown in FIG. 2D, in order to expose the second portion 12 of the semiconductor substrate 10, the fifth insulating film 70, the first conductive film 60, and the fourth insulating film 50 is etched and patterned using the photoresist film 80 as a mask. Therefore, the fifth insulating film pattern 70a, the first conductive film pattern 60a, and the fourth insulating film pattern 50a is formed on the first portion 11 of the semiconductor substrate 10, and the photoresist pattern 70a is then removed.

Subsequently, a sixth insulating film 90 is formed on the exposed surface (the second portion 12) of the substrate 10, a second conductive film 100 on the fifth insulating film pattern 70a and the sixth insulating film 90, and a planarization film 110 on the second conductive film 100. The sixth insulating film 90 is a thermal silicon oxide film grown through a thermal oxidation process. Since oxidation of silicon proceeds not only the upper surface of the exposed substrate 10, but also the exposed side surface of the first conductive film pattern 60a, the result is oxidized. Preferably, a thickness of the sixth insulating film 90 is thicker than that of the fourth insulating film 50. The second conductive film 100 is a polysilicon film, and the planarization film 110 is a spin-on-glass film.

Figure 2E:
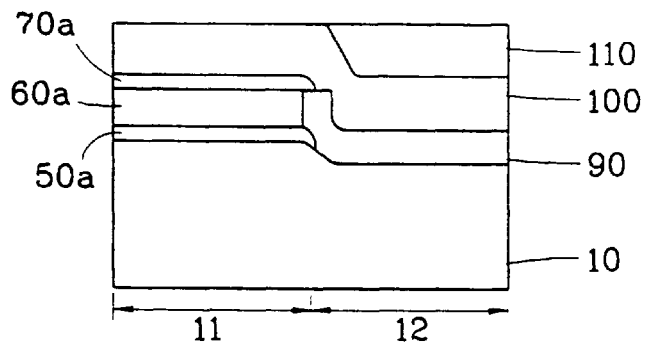
Figure 2F:
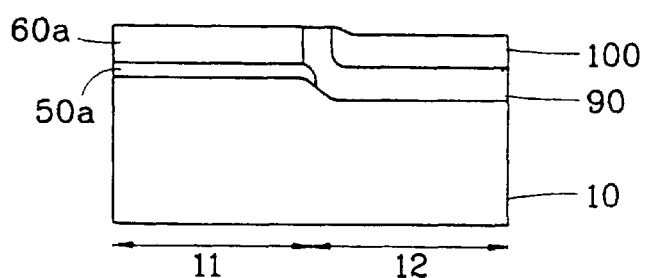

As shown in FIG. 2E and 2F, the second conductive film 100 of the first portion 11 and the planarization film 110 is removed form the substrate 10 through a dry etch or an etch-back process.

Figure 2G:
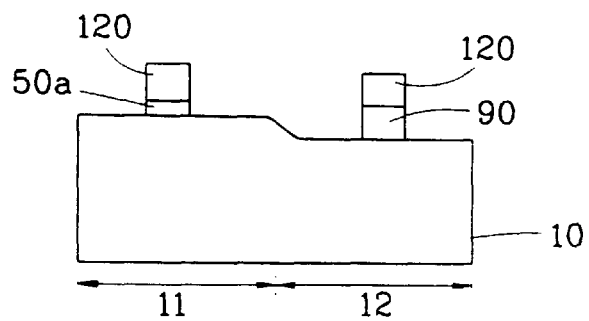

As shown in FIG. 2G, the first conductive film 60a and the second conductive film 100 is etched and patterned, thereby a gate electrode 120 is respectively formed on the first portion 11 and the second portion 12 of the semiconductor substrate 10.

The fabrication method of the gate electrode having the dual gate insulating film according to the present invention has an advantage of protecting a gate insulating film from contamination due to a metallic and carbonaceous elements of the photoresist film, and improving reliability of the semiconductor device by forming the gate insulating films having well-controlled thicknesses when fabricating at least two gate electrodes on a semiconductor substrate.

It will be apparent to those skilled in the art that various modifications and variations can be made in the fabrication method of the gate electrode having the dual gate insulating film of the present invention without departing from the spirit or scope of the invention. Thus, it is intended that the present invention cover the modifications and variations of this invention provided they come within the scope of the appended claims and their equivalents.

What is claimed is:

1. A method of fabricating a gate electrode having dual gate insulating films comprising the steps of:

providing a substrate having a first portion and a second portion;

forming a first insulating film on the substrate and a second insulating film on the first insulating film;

removing the second insulating film corresponding to the first portion to expose the first insulating film;

forming a third insulating film by oxidizing the second portion of the substrate;

removing the first, the second, and the third insulating films to form a step in the substrate between the first portion and the second portion;

forming a fourth insulating film on the first portion of the substrate, a first conductive film on the fourth insulating film and a fifth insulating film on the first conductive film;

forming a resist film on the first portion of the substrate;

removing the fourth insulating film, the first conductive film, and the fifth insulating film on the second portion of the substrate;

forming a sixth insulating film on the second portion of the substrate;

forming a second conductive film on the fifth and the sixth insulating films;

etching the second conductive film to expose the first conductive film on the first portion and the second conductive film on the second portion; and patterning the first and the second conductive films to form a gate electrode, wherein no field oxide region is formed between portions of the first and second conductive films remaining after patterning.

2. The method of claim 1, further comprising the steps of:

forming a planarization film on the second conductive layer corresponding to the first portion; and removing the planarization film and the second conductive layer on the second portion.

3. The method of claim 1, wherein each of the first, third, fourth, and sixth insulating films includes a silicon oxide film.

4. The method of claim 1, wherein each of the third and sixth insulating films includes a thermal silicon oxide film.

5. The method of claim 1, wherein a thickness of fourth insulating film is different from a thickness of the sixth insulating film.

6. The method of claim 1, wherein the sixth insulating film is thicker than the fourth insulating film.

7. The method of claim 1, wherein the second and the fifth insulating film includes a silicon nitride film.

8. The method of claim 1, wherein each of the first and second conductive films includes a polysilicon film.

9. The method of claim 1, wherein the planarization film includes a spin-on-glass film.

* * * * *